United States Patent
Kobayashi et al.

[11] Patent Number: 5,990,548
[45] Date of Patent: Nov. 23, 1999

[54] PLATE TYPE MEMBER FOR SEMICONDUCTOR DEVICE PACKAGE AND PACKAGE

[75] Inventors: Mitsunori Kobayashi; Akira Fukui; Kouichi Takashima, all of Hyogo, Japan

[73] Assignee: Sumitomo Electric Industries, Ltd., Osaka, Japan

[21] Appl. No.: 08/671,058

[22] Filed: Jun. 27, 1996

[30] Foreign Application Priority Data

Aug. 3, 1995 [JP] Japan ................................. 7-198302

[51] Int. Cl.[6] .......................... H01L 23/10; H01L 23/48; H01L 23/52
[52] U.S. Cl. ......................... 257/706; 257/762; 257/763
[58] Field of Search .................... 257/706, 762, 257/763

[56] References Cited

U.S. PATENT DOCUMENTS

| | | | |
|---|---|---|---|
| 4,680,618 | 7/1987 | Kuroda et al. | 357/24 |
| 4,877,577 | 10/1989 | Futatsuka et al. | 420/473 |
| 4,965,659 | 10/1990 | Sasame et al. | 257/747 |
| 5,015,803 | 5/1991 | Mahulikar et al. | 174/52.4 |
| 5,334,346 | 8/1994 | Kim et al. | 420/4.85 |

FOREIGN PATENT DOCUMENTS

| | | |
|---|---|---|
| 59-21032 | 2/1984 | Japan . |
| 59-46050 | 3/1984 | Japan . |
| 1-151252 | 6/1989 | Japan . |

*Primary Examiner*—Teresa M. Arroyo
*Attorney, Agent, or Firm*—W. F. Fasse; W. G. Fasse

[57] ABSTRACT

A plate type member of a Cu—W and/or Mo alloy can be bonded to a ceramic member or the like to form a semiconductor device package without problems, because the degree of warping of the plate type member during a heating step in its fabrication is suppressed. In the plate type member consisting of a Cu—W and/or Mo alloy, including a small amount of alkaline earth metal impurity the difference between alkaline earth metal contents in upper and lower halves of the member along the thickness direction is not more than 10 ppm, or delete "an alkaline earth" preferably not more than 5 ppm relative to the content of W and/or Mo. This plate type member is manufactured by reducing the alkaline earth metal content in W and/or Mo raw material powder, or standing a skeleton vertically upright on a refractory plate for carryiing out Cu infiltration, and performing homogeneous heating and cooling replace during the manufacturing thereby preventing maldistribution of the alkaline earth metal.

16 Claims, 4 Drawing Sheets

PLATE TYPE MEMBER FOR SEMICONDUCTOR DEVICE PACKAGE AND PACKAGE

BACKGROUND OF THE INVENTION

1. Field of the Invention

The present invention relates to a plate type member consisting of a copper-tungsten and/or molybdenum alloy which is applied to a package for a semiconductor device, a method of manufacturing the same, and a package for a semiconductor device employing the plate type member.

2. Description of the Background Art

As integrated circuits and high frequency/high output transistors are implemented with higher density of integration and higher outputs, power consumption is increased year by year, while the sizes and heating values of semiconductor devices employed therefor are also increased in response. Following such circumstances, packages for housing the semiconductor devices are increased in size, while members such as substrates for mounting the semiconductor devices and radiating plates having excellent heat radiation properties are required for the packages.

In general, a copper-tungsten, copper-molybdenum or copper-tungsten-molybdenum alloy (hereinafter referred to as a copper-tungsten and/or molybdenum alloy) having an excellent heat radiation property is employed as the material for a substrate serving as a member for a semiconductor device package for improving its heat radiation property and the thermal expansion coefficient of the substrate is matched with those of a ceramic member and a semiconductor chip, thereby obtaining a highly reliable package, as described in Japanese Patent Laying-Open No. 59-21032 (1984) (corresponding to U.S. Pat. No. 4,680,618) or 59-46050 (1984).

Such a copper-tungsten and/or molybdenum alloy is prepared by an infiltration method of adding copper powder to tungsten powder and/or molybdenum powder as needed, sintering the mixture and infiltrating copper in the obtained skeleton, or a sintering method of sintering a compact of copper powder and tungsten powder and/or molybdenum powder. In order to suppress structural defects such as blowholes, an iron family metal may be added by 0.02 to 2 percent by weight in the infiltration method or within 8 percent by weight in the sintering method.

In case of integrating a plate type member consisting of the aforementioned copper-tungsten and/or molybdenum alloy into a package for a semiconductor device, brazing is generally performed for bonding the member to a ceramic member serving as a counterpart. In advance of this brazing, nickel plating such as electrolytic nickel plating and/or electroless nickel-phosphorus plating, electroless nickel-boron plating or the like is performed on the plate type member for improving the brazing property and corrosion resistance and forming an underlayer for gold plating etc. which may be performed in a later step. The electrolytic nickel plating may be performed with addition of a metal such as cobalt.

As a pretreatment for this nickel plating, the plate type member is heated to 780 to 900° C. under a general temperature condition in a non-oxidizing or reducing atmosphere, for the purpose of activating its surface and/or improving adhesion after the plating and adjusting brazing flowability. However, the plate type member of the copper-tungsten and/or molybdenum alloy is disadvantageously warped due to this heat treatment.

Such a warp of the plate type member of the copper-tungsten and/or molybdenum alloy causes the formation of a clearance between the bonding surfaces of the same and the ceramic member, i.e., between the brazing layers, and deteriorates the airtightness of the package. The degree of warp is increased as the diameter (in case of a circular plate) or the diagonal length (in case of a rectangular plate) of the plate type member consisting of a copper-tungsten and/or molybdenum alloy, which has been about 15 mm in general, is increased to 30, 40, 50 or 60 mm due to size increase of the package, to result in a serious problem in assembling of the plate type member and the ceramic member by brazing.

Due to requirements of improveming the yield and reducing of the cost of brazing filler metals in package manufacturers, the requirement for further reduction of the warp is increased also in relation to a plate type member of a copper-tungsten and/or molybdenum alloy having smaller sizes than heretofore provided.

In order to prevent the plate type member of the copper-tungsten and/or molybdenum alloy from suffering such a warp before assembling, it is important to uniformly and sufficiently remove a lubricant of an organic compound in order to easily compact the material so that no carbon remains and/or segregates in the alloy, and to uniformalize the compacting density distribution. Even if carbon is sufficiently removed and the density distribution of a compacted body is uniformalized, however, the occurrence of a warp caused by heating in a plating step cannot be completely prevented.

SUMMARY OF THE INVENTION

In consideration of such circumstances of the prior art, an object of the present invention is to provide a plate type member consisting of a copper-tungsten and/or molybdenum alloy which can be bonded to a ceramic member or the like with no trouble of by suppressing the occurrence of deformations such as warping in a heating step, and to provide a highly reliable package for a semiconductor device employing the plate type member.

In order to attain the aforementioned object, the inventors analyzed warped plate type members of copper-tungsten and/or molybdenum alloys in detail for investigating the cause for such warps. To their surprise, the inventors discovered that a concentration gradient of an alkaline earth metal represented by calcium is present along the thickness direction of each alloy and the warp is increased as the gradient is increased.

It is difficult to precisely measure the concentration gradient, and hence the inventors divided each sample of plate type members into two parts along its thickness direction, and measured the contents of the alkaline earth metal in the upper and lower parts, to obtain the difference therebetween. The metal contents were measured by an ICP (inductively coupled plasma atomic emission spectroscopy) method. In the measurement of the metal contents by this method, a single surface of an infiltrated or sintered body was removed by about 0.1 to 0.3 mm, and thereafter the infiltrated or sintered body was cut into upper and lower halves along its thickness direction, and dissolved in acid, thereby preparing each sample. Consequently, they discovered that the occurrence of warping is extremely small when the difference between the contents of the alkaline earth metal is less than 2 ppm, the occurrence of warping begins when the difference exceeds 2 ppm, the degree of warping increases when the difference exceeds 5 ppm, and the degree of warping increases extremely when the difference exceeds 10 ppm, to reach the present invention.

Accordingly, a plate type member suitable to be applied to a package for a semiconductor device, which is mainly composed of a copper-tungsten alloy, a copper-molybdenum alloy or a copper-tungsten-molybdenum alloy, provided by the present invention is characterized in that the difference between alkaline earth metal contents in upper and lower halves of the plate type member along its thickness direction is not more than 10 ppm, preferably not more than 5 ppm, and more preferably not more than 2 ppm.

While the mechanism by which the alkaline earth metal causes warping has not yet been clarified, it is conceivable that the alkaline earth metal inhibits shrinkage of a skeleton of tungsten and/or molybdenum existing in the alloy due to the progress of sintering. In other words, it is conceivable that contraction of a surface on a side containing a larger amount of the alkaline earth metal is suppressed while that of a surface on a side having a smaller amount of the alkaline earth metal progresses during heating in a plating step, to cause a warp depressing the side having a smaller amount of the alkaline earth metal.

In consideration of the influence exerted by the alkaline earth metal on the occurrence of a warp, it may also be effective to reduce the absolute amount of the alkaline earth metal, as another idea of suppressing the degree of warp. The inventors conducted a study on the basis of this idea, to recognize that the concentration difference between the upper and lower halves of the plate type member is indispensably reduced and the degree of warp is remarkably reduced when the content of the alkaline earth metal is reduced to not more than 5 ppm per tungsten and/or molybdenum component, the degree of warp is extremely reduced when the alkaline earth metal content is not more than 3 ppm, and the degree of warp is negligibly reduced when the content is not more than 1 ppm.

Accordingly, another plate type member of a copper-tungsten and/or molybdenum alloy provided by the present invention is characterized in that an alkaline earth metal content is not more than 5 ppm, preferably not more than 3 ppm, and more preferably not more than 1 ppm per tungsten and/or molybdenum component.

In general, tungsten powder or molybdenum powder readily contains calcium as an impurity, typically among alkaline earth metals. Apart from specific and high-priced high purity products, the calcium purity standard for general powder which is employed in the present invention is not more than 20 ppm and about 10 ppm in practice in case of tungsten powder, or not more than 40 ppm and about 10 ppm in practice in case of molybdenum powder. While high purity products are generally high-priced, such a high purity product restricted to an alkaline earth metal such as calcium is not that expensive, and the advantageous economic property of the present invention is not damaged by employment thereof.

In preparation of a conventional copper-tungsten and/or molybdenum alloy, a skeleton or a compact is laid down to be in surface contact with a refractory plate and heated/cooled during infiltration of copper or sintering of compact. In this method, however, the surface facing the refractory plate which is hard to cool is cooled at a slower speed than the opposite surface exposed to atmosphere gas, and hence solidification of the melted copper or copper alloy is retarded. Consequently, the impurity concentration is increased on the surface facing the refractory plate, to cause a concentration gradient.

According to the present invention, therefore, infiltration of copper or sintering of a compact is performed in a state of a skeleton or a compact standing on a refractory plate or obliquely sloping relative to the refractory plate so as not to be in surface contact therewith, in order to minimize the difference between the cooling speeds on both surfaces of the skeleton or the compact.

In more concrete terms, a skeleton which is stood or obliquely placed on a refractory plate is held by ceramic bars or the like with copper plates placed on both sides thereof, and heated in a hydrogen atmosphere furnace to be infiltrated in an infiltration method. Consequently, the difference between alkaline earth metal contents in upper and lower halves, which would be 12 ppm in general, is extremely reduced to 2 ppm, whereby a warp caused by a heat treatment in a plating step can be extremely reduced. Also in case of a sintering method, a compact is held in a similar state and sintered, whereby the difference between alkaline earth metal contents is reduced and the degree of warp can be reduced.

Alternatively, a plate type member of a copper-tungsten and/or molybdenum alloy which is completely infiltrated in an ordinary manner is stood vertically or obliquely placed on a refractory plate so as not to be in surface contact with the same, is again heated to a temperature exceeding the melting point of copper or the copper alloy and thereafter cooled, whereby the difference between alkaline earth metal contents in upper and lower halves of the plate type member can be reduced. Also as to a plate type member completely sintered in an ordinary manner, the difference between alkaline earth metal contents in upper and lower halves of the member can be reduced by similarly standing or placing the member on a refractory plate, heating the same to a temperature exceeding the melting point of copper or the copper alloy and thereafter cooling the same.

Further, a plate type member of a copper-tungsten and/or molybdenum alloy which is completely infiltrated in an ordinary manner is heated for a long time at a highest possible temperature which is less than the melting point of copper or the copper alloy and thereafter cooled, whereby the alkaline earth metal can be diffused to be uniformalized in distribution. Similarly, a plate type member which is completely sintered in an ordinary manner is heated for a long time at a highest possible temperature which is less than the melting point of copper or the copper alloy and thereafter cooled, whereby the alkaline earth metal can be diffused to be uniformalized in distribution. In such a heat treatment at a temperature which is less than the melting point of copper or the copper alloy, the manner or orientation of placing the plate type member does not have much effect on the result.

This heat treatment is effective whether the plate type member is cooled to a temperature below the solidifying point of the melted metal from the infiltration temperature and then subjected to continuous heating or the same is temporarily cooled to the ordinary room temperature and thereafter re-heated. The heating temperature must be at a high level which is less than the melting point of copper or the copper alloy and within 200° C. under the melting point in order to quickly cause diffusion of the alkaline earth metal such as calcium. The heat treatment requires only a short time if the heating temperature is within 100° C. under the melting point, more preferably within 50° C.

Also when copper powder is previously added before compacting in the so-called pre-blending in preparation of a skeleton in the infiltration method, the effect of the present invention is similarly attained as a matter of course. As another means, it is also possible to embed the member in alumina powder in infiltration or sintering for uniformalizing the cooling speed, rapidly cool the member after infiltration or sintering for preventing segregation of calcium, or add excess copper in infiltration for making the same absorb calcium. Further, it is possible to add an iron family metal by 0.02 to 2 percent by weight in the infiltration method or within 8 percent by weight in the sintering method as in the prior art in order to suppress structural defects such as blowholes, as a matter of course.

The present invention is summarized as follows:

A plate type member which is suitable to be applied to a package for a semiconductor device according to an aspect of the present invention is mainly composed of one copper alloy selected from a group consisting of a copper-tungsten alloy, a copper-molybdenum alloy and a copper-tungsten-molybdenum alloy and consists of first and second half body regions along its thickness direction, while the difference between the amounts of an alkaline earth metal contained in the first and second half body regions is not more than 10 ppm, preferably not more than 5 ppm, and more preferably not more than 2 ppm.

Preferably, the inventive plate type member has a rectangular or circular flat surface, with a diagonal length or a diameter of at least 40 mm, or at least 70 mm.

In a plate type member according to another aspect of the present invention, the content of an alkaline earth metal which is contained in the plate type member is not more than 5 ppm, preferably not more than 3 ppm, and more preferably not more than 1 ppm with respect to the amount of the tungsten and/or molybdenum component.

Calcium can be listed as a typical example of the alkaline earth metal contained in the plate type member.

A package for a semiconductor device according to still another aspect of the present invention comprises a plate type member having the aforementioned characteristics, and an envelope member which is mounted on the plate type member. The semiconductor device is mounted on the plate type member or the envelope member.

A method of manufacturing a plate type member according to a further aspect of the present invention comprises the steps of:

(i) sintering tungsten powder and/or molybdenum powder thereby preparing a plate type skeleton having holes; and (ii) infiltrating copper into the holes of the plate type skeleton after having placed the plate type skeleton on a refractory plate so that its major surface is not in surface contact with that of the refractory plate and the longitudinal directions of the major surfaces of the plate type skeleton and the refractory plate intersect with each other.

Preferably, the plate type skeleton is prepared by sintering a mixed powder which is prepared by adding copper powder to the tungsten powder and/or the molybdenum powder in the step of preparing the plate type skeleton.

A method of preparing a plate type member according to a further aspect of the present invention comprises the steps of:

(i) molding a mixed powder of copper powder and tungsten powder and/or molybdenum powder thereby obtaining a plate type compact; and (ii) sintering the plate type compact after having placed the same on a refractory plate so that its major surface is not in surface contact with that of the refractory plate and the longitudinal directions of the major surfaces of the plate type compact and the refractory plate intersect with each other.

A method of preparing a plate type member according to a further aspect of the present invention comprises the steps of:

(i) preparing an infiltrated body by infiltrating copper into holes of a plate type skeleton obtained by sintering tungsten powder and/or molybdenum powder; and (ii) heat treating the infiltrated body at a temperature exceeding the melting point of copper or a copper alloy after having placed the infiltrated body on a refractory plate so that its major surface is not in surface contact with that of the refractory plate and the longitudinal directions of the major surfaces of the infiltrated body and the refractory plate intersect with each other.

A method of preparing a plate type member according to a further aspect of the present invention comprises the steps of:

(i) preparing a sintered body by sintering a plate type compact of mixed powder of copper powder and tungsten powder and/or molybdenum powder; and (ii) heat treating the sintered body at a temperature exceeding the melting point of copper or a copper alloy after having placed the sintered body on a refractory plate so that its major surface is not in surface contact with that of the refractory plate and the longitudinal directions of the major surfaces of the sintered body and the refractory plate intersect with each other.

A method of preparing a plate type member according to a further aspect of the present invention comprises the steps of:

(i) preparing an infiltrated body by infiltrating copper into holes of a plate type skeleton obtained by sintering tungsten powder and/or molybdenum powder; and (ii) heat treating the infiltrated body at a temperature which is less than the melting point of copper or a copper alloy and between the melting point and a temperature lower than the melting point by 200° C.

A method of preparing a plate type member according to a further aspect of the present invention comprises the steps of:

(i) preparing a sintered body by sintering a plate type compact of a mixed powder of copper powder and tungsten powder and/or molybdenum powder; and (ii) heat treating the sintered body at a temperature which is less than the melting point of copper or a copper alloy and between the melting point and a temperature lower than the melting point by 200° C.

In each of the aforementioned two methods of manufacturing plate type members, the heat treatment step is adapted to heat treat the infiltrated body or the sintered body preferably at a temperature which is less than the melting point of copper or the copper alloy and between the melting point and a temperature lower than the melting point by 100° C., and more preferably at a temperature which is less than the melting point of copper or the copper alloy and between the melting point and a temperature lower than the melting point by 50° C.

In each of the aforementioned methods of manufacturing plate type members, the amount of an alkaline earth metal which is contained in the tungsten powder and/or the molybdenum powder is not more than 5 ppm, preferably not more than 3 ppm, and more preferably 1 ppm. Calcium can be listed as a typical example of such an alkaline earth metal.

According to the present invention, it is possible to reduce the difference between contents of an alkaline earth metal such as calcium in upper and lower halves of a plate type member along its thickness direction for reducing the degree of warp occurring during heating in a plating step or the like also when ordinary tungsten powder and/or molybdenum powder is employed in fabrication of the plate type member consisting of a copper-tungsten alloy, a copper-molybdenum alloy or the copper-tungsten-molybdenum alloy.

When tungsten powder and/or molybdenum powder having a small alkaline earth metal content is employed, the content of the alkaline earth metal such as calcium can be reduced in the overall plate type member at a cost which compares to that for a general grade of such powder while the difference between the alkaline earth metal contents in the upper and lower halves along the thickness direction can be reduced, whereby it is possible to reduce the degree of warp occurring during heating in a plating step or the like.

Thus, a warp of the plate type member can be remarkably suppressed as compared with the prior art in an assembling step for brazing the plate type member to a ceramic member or the like by employing the inventive plate type member, whereby a remarkable effect can be attained in improvement of airtightness of a package for a semiconductor device and improvement of the yield. The effect of reducing the degree of warp of a plate type member according to the present invention is rendered remarkable as the diameter or the diagonal length of the plate type member is increased, such that the degree of warp can be halved or further reduced in case of a plate type member having a diameter or a diagonal length of at least 40 mm, in particular.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

EXAMPLE 1

Respective powder materials selected from tungsten, molybdenum, copper, nickel, cobalt and iron were mixed with each other, embossed/molded and heated to 1000 to 1300° C. in a hydrogen atmosphere after removal of lubricants, to obtain skeletons. The calcium content in the employed tungsten powder was 9 ppm, and that in the molybdenum powder was 10 ppm. These metals were determined by the ICP method.

Figure 1:
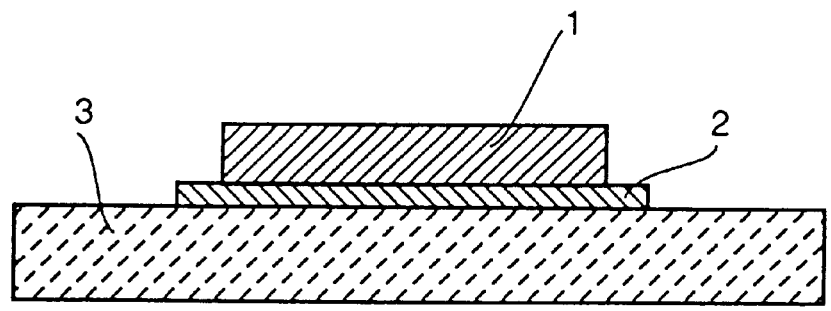
FIG. 1 is a sectional view showing a general mounted state of a skeleton in conventional infiltration.

In accordance with a conventional method, each skeleton 1 was laid on a copper plate 2, which in turn was placed on a refractory plate 3 as shown in FIG. 1 and heated to 1200° C. in a hydrogen atmosphere, thereby melting the copper plate 2 and infiltrating copper into holes of the skeleton 1. Thus, Cu—W/Mo alloys were obtained in compositions shown in Table 1 and dimensions slightly larger than those shown in Table 2. Upper and lower surfaces and outer peripheries of the respective alloys were ground to form plate type members in the dimensions shown in Table 2.

Figure 2:
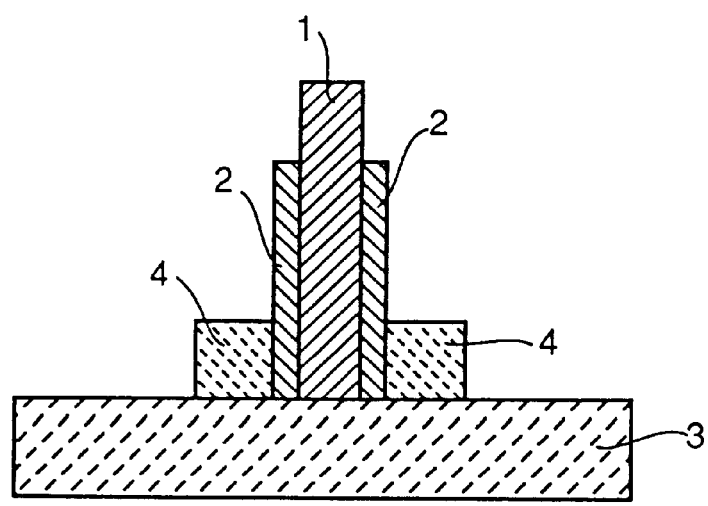
FIG. 2 is a sectional view showing a mounted state of a skeleton in case of infiltration according to the present invention.

In accordance with the inventive method, on the other hand, each skeleton 1 was stood vertically upright on a refractory plate 3, held by copper plates 2 from both sides thereof, and further supported by alumina bars 4 as shown in FIG. 2, and heated to 1200° C. in a hydrogen atmosphere, thereby melting the copper plates 2 and infiltrating copper into holes of the skeleton 1. Thus, Cu—W/Mo alloys were obtained in the compositions shown in Table 1 and dimensions slightly larger than those shown in Table 2. Upper and lower surfaces and outer peripheries of the respective alloys were ground to form plate type members in the dimensions shown in Table 2.

TABLE 1

| Alloy Composition | IW-10 | IW-20 | IW-30 | IM-10 | IM-20 | IWM-10 |
|---|---|---|---|---|---|---|
| W | 89.5 | 79.0 | 70.0 | — | — | 64.98 |
| Mo | — | — | — | 88.0 | 79.5 | 25.00 |
| Cu | 10.0 | 20.0 | 30.0 | 10.0 | 20.0 | 10.00 |
| Ni | 0.5 | — | — | — | — | 0.02 |
| Co | — | 1.0 | — | 2.0 | 0.2 | — |
| Fe | — | — | — | — | 0.3 | — |

(Note) unit: wt. %

TABLE 2

| Dimensions of Plate Type members (mm) |
|---|
| a:15 × 15 × 1.5 (21.2) |
| b:20 × 20 × 1.5 (28.3) |
| c:25 × 25 × 1.5 (35.4) |
| d:30 × 30 × 1.5 (42.4) |
| e:35 × 35 × 1.5 (49.5) |
| f:40 × 40 × 1.5 (56.6) |
| g:45 × 45 × 1.5 (63.6) |
| h:50 × 50 × 1.5 (70.7) |
| i:55 × 55 × 1.5 (77.8) |
| j:60 × 60 × 1.5 (84.9) |
| k:65 × 65 × 1.5 (91.9) |
| l:70 × 70 × 1.5 (99.0) |

(Note) Parenthesized numerals indicate diagonal lengths.

Each of these plate type members was subjected to a heat treatment of heating the plate type member to 850° C. in a hydrogen atmosphere and thereafter cooling the same to the ordinary room temperature by five cycles in total as model conditions for evaluation of a warp in a heat treatment in a plating step. The degree of warp was measured by setting each sample on a horizontal surface plate while upwardly directing a convexly warped surface, confirming the difference in height between the plate type member and the plane of the surface plate in the diagonal direction, and obtaining the difference between the maximum and minimum values as the degree of warp. Table 3 shows the degrees of such warps. On the other hand, the difference between Ca contents in upper and lower halves of each plate type member along its thickness direction was measured by the ICP method to obtain the difference therebetween. Table 3 also shows such differences between the Ca contents.

TABLE 3

| Alloy Composition | Dimensions | Conventional Method (FIG. 1) | | Inventive Method (FIG. 2) | |
|---|---|---|---|---|---|
| | | Ca Content Difference (ppm) | Warp (μm) | Ca Content Difference (ppm) | Warp (μm) |
| IW-10 | a | 15 | 38 | 3 | 10 |
| IW-10 | b | 14 | 44 | 2 | 12 |
| IW-10 | c | 13 | 47 | 3 | 16 |
| IW-10 | d | 14 | 56 | 2 | 21 |
| IW-10 | e | 15 | 68 | 3 | 22 |
| IW-10 | f | 12 | 73 | 2 | 25 |
| IW-10 | g | 14 | 94 | 2 | 29 |
| IW-10 | h | 13 | 101 | 1 | 31 |
| IW-10 | i | 13 | 116 | 2 | 34 |
| IW-10 | j | 13 | 122 | 2 | 39 |
| IW-10 | k | 11 | 134 | 1 | 42 |
| IW-10 | l | 12 | 139 | 0 | 45 |
| IW-20 | d | 17 | 57 | 3 | 17 |
| IW-30 | h | 15 | 113 | 2 | 32 |
| IM-10 | h | 15 | 121 | 3 | 35 |
| IM-20 | h | 14 | 1114 | 1 | 31 |
| IWM-10 | h | 18 | 125 | 3 | 37 |

(Note) Each warp is indicated by an average value of n = 20, and each Ca content difference was obtained as to a single sample.

As understood from the results shown in Table 3, maldistribution of the Ca contents was reduced, and it was possible to remarkably reduce warps of the plate type members according to the present invention. According to the present invention, further, the degrees of warps, which were in excess of 50 μm in the conventional samples, were halved to 20 to 30 μm in the samples of dimensions beyond those of d with the diagonal length exceeding 40 mm. In the samples of dimensions beyond those of h with the diagonal length exceeding 70 mm, further, it was possible to reduce the degrees of warps, which were in excess of 100 μm in the conventional samples, to not more than ⅓.

EXAMPLE 2

Respective powder materials selected from tungsten, molybdenum, copper, nickel, cobalt and iron were mixed with each other and embossed/molded to obtain compacts, and thereafter lubricants were removed. The calcium content in the employed tungsten powder was 9 ppm, and that in the molybdenum powder was 10 ppm.

Figure 3:
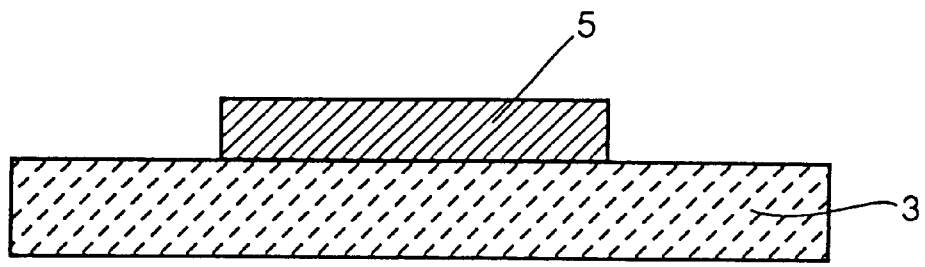
FIG. 3 is a sectional view showing a general mounted state of a compact in conventional sintering.

In accordance with a conventional method, each compact 5 was laid on a refractory plate 3 to be in surface contact with the same as shown in FIG. 3 and heated to 1400° C. in a hydrogen atmosphere, thereby melting copper powder contained in the compact 5 and causing liquid phase sintering. Thus, Cu—W/Mo alloys were obtained in compositions shown in Table 4 and dimensions slightly larger than the dimensions i shown in Table 2. Upper and lower surfaces and outer peripheries of the respective alloys were ground to form plate type members in the dimensions i shown in Table 2.

In accordance with the inventive method, on the other hand, each compact 5 was stood vertically upright on a refractory plate 3, held by alumina bars 4 from both sides thereof, and heated to 1400° C. in a hydrogen atmosphere, thereby melting copper powder contained in the compact 5 and causing liquid phase sintering. Thus, Cu—W/Mo alloys were obtained in the compositions shown in Table 4 and dimensions slightly larger than the dimensions i shown in Table 2. Upper and lower surfaces and outer peripheries of the respective alloys were ground to form plate type members in the dimensions i shown in Table 2.

TABLE 4

| Alloy Composition | SW-10 | SW-20 | SW-30 | SM-10 | SM-20 | SWM-10 |
|---|---|---|---|---|---|---|
| W | 89.5 | 79.0 | 70.0 | — | — | 64.98 |
| Mo | — | — | — | 88.0 | 79.5 | 25.00 |
| Cu | 10.0 | 20.0 | 30.0 | 10.0 | 20.0 | 10.00 |
| Ni | 0.5 | — | — | — | — | 0.02 |
| Co | — | 1.0 | — | 2.0 | 0.2 | — |
| Fe | — | — | — | — | 0.3 | — |

(Note) unit: wt. %

Each of these plate type members (dimensions i: 50×50× 1.5 mm) was subjected to a heat treatment of heating the plate type member to 850° C. in a hydrogen atmosphere and thereafter cooling the same to the ordinary room temperature by five cycles in total as model conditions for evaluation of a warp in a heat treatment in a plating step. On the other hand, the difference between Ca contents in upper and lower halves of each plate type member was obtained, similarly to Example 1. Consequently, maldistribution of the Ca contents was eliminated and it was possible to remarkably reduce the degrees of warps of the plate type members according to the present invention, as shown in Table 5.

TABLE 5

Figure 4:
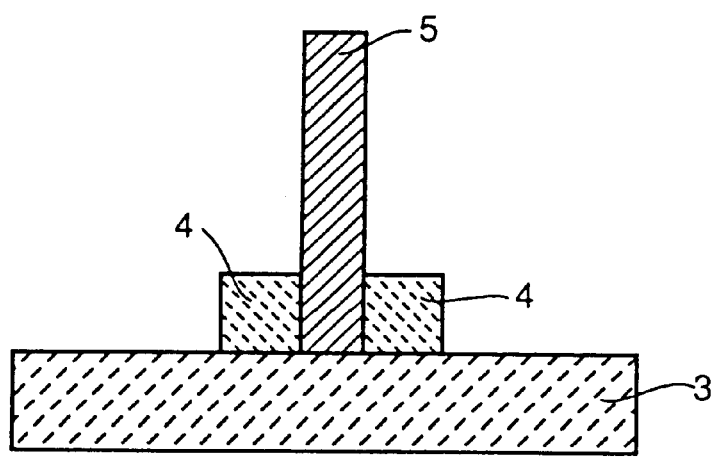
FIG. 4 is a sectional view showing a mounted state of a compact in sintering according to the present invention.

| Alloy Composition | Dimensions | Conventional Method (FIG. 3) | | Inventive Method (FIG. 4) | |
|---|---|---|---|---|---|
| | | Ca Content Difference (ppm) | Warp (μm) | Ca Content Difference (ppm) | Warp (μm) |
| SW-10 | i | 14 | 124 | 3 | 36 |
| SW-20 | i | 12 | 116 | 2 | 31 |
| SW-30 | i | 11 | 105 | 2 | 32 |
| SM-10 | i | 15 | 125 | 3 | 33 |
| SM-20 | i | 14 | 123 | 1 | 15 |
| SWM-10 | i | 13 | 121 | 3 | 35 |

(Note) Each warp is indicated by an average value of n = 20, and each Ca content difference was obtained as to a single sample.

EXAMPLE 3

Respective powder materials of tungsten, copper and nickel were mixed with each other, and heated to 1250° C. in a hydrogen atmosphere after removal of lubricants, to obtain skeletons. The calcium content in the employed tungsten powder was 9 ppm.

In accordance with the conventional method, each skeleton 1 was laid on a copper plate 2, which in turn was placed on a refractory plate 3 as shown in FIG. 1 and heated to 1200° C. in a hydrogen atmosphere, thereby melting the copper plate 2 and infiltrating copper into holes of the skeleton 1, similarly to Example 1. Thus, Cu—W alloys were obtained in the composition of IW-10 shown in Table 1 and dimensions slightly larger than the dimensions h shown in Table 2. Upper and lower surfaces and outer peripheries of the respective alloys were ground to form plate type members in the dimensions h shown in Table 2.

Figure 5:
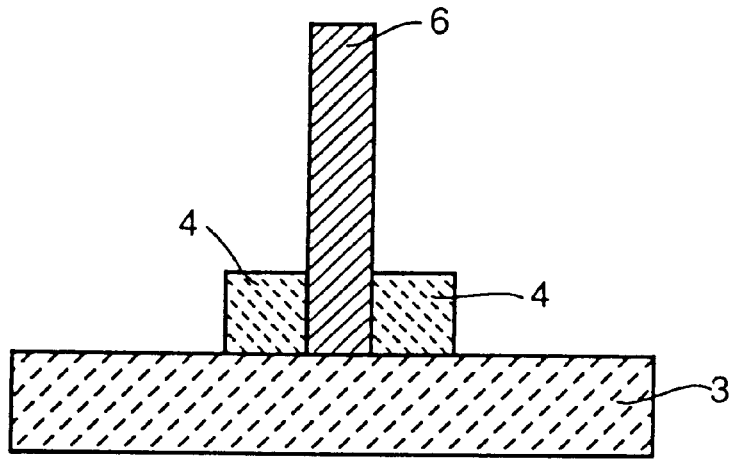
FIG. 5 is a sectional view showing a mounted state in re-heating of an infiltrated body according to the present invention.

As samples of the present invention, copper was infiltrated in the skeletons in accordance with the conventional method as described above, to obtain infiltrated bodies of Cu—W alloys in the composition of IW-10 shown in Table 1 and dimensions slightly larger than the dimensions h shown in Table 2. As shown in FIG. 5, further, each infiltrated body 6 was placed on a refractory plate 3 so that both sides thereof were held and supported by alumina bars 4, and heated to 1150° C. in a hydrogen atmosphere, thereby re-melting and solidifying the components mainly composed of copper. Upper and lower surfaces and outer peripheries of the obtained alloys were ground to form plate type members in the dimensions h shown in Table 2.

Each of these plate type members was subjected to a heat treatment of heating the plate type member to 850° C. in a hydrogen atmosphere and thereafter cooling the same to the ordinary room temperature by five cycles in total as model conditions for evaluation of a warp in a heat treatment in a plating step. On the other hand, the difference between Ca contents in upper and lower halves of each plate type member was obtained, similarly to Example 1. Consequently, the differences between the Ca contents were reduced and it was possible to remarkably reduce the degrees of warps of the plate type members according to the present invention, as shown in Table 6.

TABLE 6

| Alloy Composition | Dimensions | Conventional Method (FIG. 1) | | Inventive Method (FIG. 5) | |
|---|---|---|---|---|---|
| | | Ca Content Difference (ppm) | Warp ($\mu$m) | Ca Content Difference (ppm) | Warp ($\mu$m) |
| IW-10 | h | 12 | 98 | 3 | 35 |

(Note) Each warp is indicated by an average value of n = 20, and each Ca content difference was obtained as to a single sample.

EXAMPLE 4

Respective powder materials of tungsten, copper and nickel were mixed with each other, embossed/molded, and heated to 1200° C. in a hydrogen atmosphere after removal of lubricants, to obtain skeletons. The calcium content in the employed tungsten powder was 9 ppm.

As a sample of the conventional method, a skeleton 1 was laid on a copper plate 2, which in turn was placed on a refractory plate 3 as shown in FIG. 1 and heated to 125° C. in a hydrogen atmosphere, thereby melting the copper plate 2 and infiltrating copper into holes of the skeleton 1. Thus, a Cu—W alloy was obtained in the composition of IW-10 shown in Table 1 and dimensions slightly larger than the dimensions h shown in Table 2. Upper and lower surfaces and the outer periphery of the alloy were ground to form a plate type member in the dimensions h shown in Table 2.

As samples of the present invention and comparative example, copper was infiltrated in the skeletons in the conventional method shown in FIG. 1 similarly to the above, to obtain infiltrated bodies in the composition of IW-10 shown in Table 1 and dimensions slightly larger than the dimensions h shown in Table 2. Then, the infiltrated bodies were laid on refractory plates so as to be in surface contact with the same similarly to FIG. 1, and heat treated at 833 to 1100° C. in a hydrogen atmosphere again. Upper and lower surfaces and outer peripheries of the obtained Cu—W alloys were ground to form plate type members in the dimensions h shown in Table 2.

Each of these plate type members was subjected to a heat treatment of heating the plate type member to 850° C. in a hydrogen atmosphere and thereafter cooling the same to the ordinary temperature by five cycles in total as model conditions for evaluation of a warp in a heat treatment in a plating step. Table 7 shows the degrees of warps. Table 7 also shows the differences between Ca contents in upper and lower halves of the plate type members, which were obtained similarly to Example 1.

TABLE 7

| Sample | Dimensions | Reheating Temperature (° C.) | Ca Content Difference (ppm) | Warp ($\mu$m) |
|---|---|---|---|---|
| Conventional Example | h | not reheated | 12 | 121 |
| Comparative Example | h | 833 (−250) | 12 | 120 |
| Inventive Example | h | 883 (−200) | 10 | 85 |
| Inventive Example | h | 933 (−150) | 9 | 78 |
| Inventive Example | h | 983 (−100) | 7 | 47 |
| Inventive Example | h | 1033 (−50) | 4 | 36 |
| Inventive Example | h | 1050 (−33) | 2 | 29 |
| Comparative Example | h | 1100 (exceeding melting point) | 12 | 118 |

(Note) Parenthesized numerals indicate temperature differences between the reheating temperatures and the melting points of the alloys.

As understood from the results shown in Table 7, the degree of warp, which was in excess of 100 $\mu$m in the conventional sample, was reduced to not more than 100 $\mu$m through the reheating treatment at a temperature within 200° C. under the melting point, while the degrees of warps were remarkably reduced to not more than 50 $\mu$m for a reheating temperature within 100° C. and not more than 40 $\mu$m for a reheating temperature within 50° C. under the melting point. No effect of such reduction of the warp was recognized in heating at a temperature which was lower than the melting point by more than 200° C., while it is understood that no effect is attained even if the skeleton is heated to a temperature exceeding the melting point in a state laid on the refractory plate.

EXAMPLE 5

Respective powder materials of tungsten, copper and cobalt were mixed with each other, embossed/molded into compacts, and thereafter lubricants were removed. The calcium content in the employed tungsten powder was 9 ppm.

In accordance with the conventional method, a compact 5 was laid on a refractory plate 3 as shown in FIG. 3 and heated to 1350° C. in a hydrogen atmosphere, thereby melting copper powder contained in the compact 5 and causing liquid phase sintering. Thus, a sintered body of a Cu—W alloy was obtained in the composition of SW-20 shown in Table 4 and dimensions slightly larger than the dimensions h shown in Table 2. Upper and lower surfaces and the outer periphery of the alloy were ground to form a plate type member in the dimensions h shown in Table 2.

Figure 6:
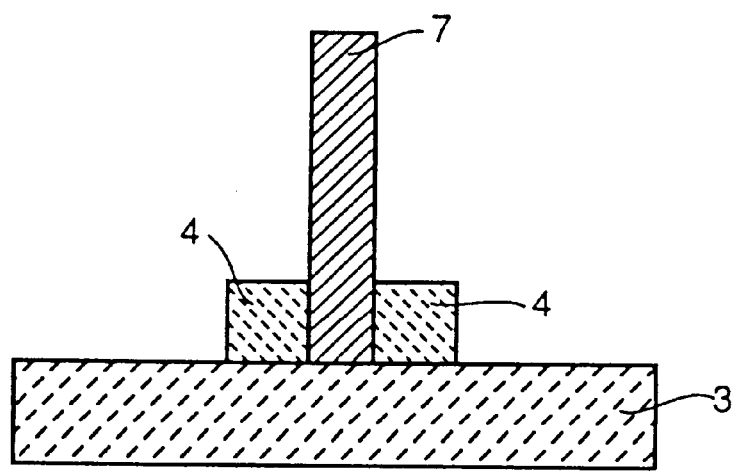
FIG. 6 is a sectional view showing a mounted state in reheating of a sintered body according to the present invention.

As a sample of the present invention, a sintered body 7 of the Cu—W alloy prepared in the aforementioned manner was stood vertically upright on a refractory plate 3 and both sides thereof were held and supported by alumina bars 4 as shown in FIG. 6, and heated to 1200° C. in a hydrogen atmosphere again, thereby re-melting and solidifying the components mainly composed of copper. Upper and lower surfaces and the outer periphery of the obtained sintered body were ground to form a plate type member in the dimensions h shown in Table 2.

These plate type members were subjected to a heat treatment of heating the plate type members to 850° C. in a hydrogen atmosphere and thereafter cooling the same to the ordinary room temperature by five cycles in total as model conditions for evaluation of warps in a heat treatment in a plating step. Further, the differences between Ca contents in upper and lower halves of the plate type members were obtained similarly to Example 1. Consequently, it was possible to remarkably reduce the degree of warp of the plate type member in accordance with the present invention, as shown in Table 8.

TABLE 8

| Sample | Dimensions | Ca Content Difference (ppm) | Warp ($\mu$m) |
|---|---|---|---|
| Conventional Example | h | 12 | 100 |
| Inventive Example | h | 2 | 27 |

Example 6

Respective powder materials of tungsten, copper and cobalt were mixed with each other, embossed/molded into compacts, and thereafter lubricants were removed. The calcium content in the employed tungsten powder was 9 ppm.

In the conventional method, a compact 5 was laid on a refractory plate 3 as shown in FIG. 3 and heated to 1350° C. in a hydrogen atmosphere, thereby melting copper powder contained in the compact 5 and causing liquid phase sintering. Thus, a sintered body of a Cu—W alloy was obtained in the composition of SW-20 shown in Table 4 and dimensions slightly larger than the dimensions h shown in Table 2. Upper and lower surfaces and the outer periphery of the sintered body were ground to form a plate type member in the dimensions h shown in Table 2.

As samples of the present invention and comparative example, sintered bodies of Cu—W alloys were similarly prepared by the conventional method shown in FIG. 3 as described above, and thereafter the sintered bodies were laid on refractory plates, and heated to 833 to 1100° C. in a hydrogen atmosphere again. Upper and lower surfaces and outer peripheries of the obtained alloys were ground to form plate type members in the dimensions h shown in Table 2.

These plate type members were subjected to a heat treatment of heating the plate type members to 850° C. in a hydrogen atmosphere and thereafter cooling the same to the ordinary room temperature by five cycles in total as model conditions for evaluation of warps in a heat treatment in a plating step. Table 9 shows degrees of warps and differences between Ca contents which were measured similarly to Example 1.

TABLE 9

| Sample | Dimensions | Reheating Temperature (° C.) | Ca Content Difference (ppm) | Warp ($\mu$m) |
|---|---|---|---|---|
| Conventional Example | h | not reheated | 11 | 119 |
| Comparative Example | h | 833 (−250) | 11 | 117 |
| Inventive Example | h | 883 (−200) | 9 | 82 |
| Inventive Example | h | 933 (−150) | 8 | 76 |
| Inventive Example | h | 983 (−100) | 7 | 47 |
| Inventive Example | h | 1033 (−50) | 3 | 34 |
| Inventive Example | h | 1050 (−33) | 2 | 28 |
| Comparative Example | h | 1100 (exceeding melting point) | 12 | 121 |

(Note) Parenthesized numerals indicate temperature differences between the reheating temperatures and the melting points of the alloys.

As understood from the results shown in Table 9, the degree of warp, which was in excess of 100 $\mu$m in the conventional sample, was reduced to not more than 100 $\mu$m through the reheating treatment at a temperature within 200° C. under the melting point, while the degrees of warps were remarkably reduced to not more than 50 $\mu$m within 100° C. and not more than 40 $\mu$m within 50° C. No effect of such reduction of the warp was recognized in heating at a temperature which was lower than the melting point in excess of 200° C., while it is understood that no effect is attained even if the skeleton is heated to a temperature exceeding the melting point in a state laid on the refractory plate.

EXAMPLE 7

Respective powder materials of tungsten, copper and nickel were mixed with each other, embossed/molded into compacts, and thereafter heated to 1250° C. in a hydrogen atmosphere with removal of lubricants, thereby obtaining skeletons. In the respective samples, tungsten powder materials having different calcium contents were employed.

As shown in FIG. 1, each skeleton 1 was laid on a copper plate 2, which in turn was placed on a refractory plate 3 and heated to 1200° C. in a hydrogen atmosphere, thereby melting the copper plate 2 and infiltrating copper into holes of the skeleton 1. Thus, Cu—W alloys were obtained in the composition of IW-10 in Table 1 and dimensions slightly larger than the dimensions d shown in Table 2. Upper and lower surfaces and outer peripheries of the respective alloys were ground to form plate type members in the dimensions d shown in Table 2.

Through the employment of the tungsten powder materials having different calcium contents, differences between the calcium contents in the upper and lower halves of the plate type members and variations of warps of the plate type members depending on the calcium contents were investigated. Table 10 shows the results. The calcium contents and the degrees of warps were measured similarly to those in Example 1.

TABLE 10

| Ca Content in W Powder (ppm) | Dimensions | Ca Content Difference in Alloy (ppm) | Ca Content per W in Alloy (ppm) | Warp (μm) |
| --- | --- | --- | --- | --- |
| 6 | d | 13 | 6 | 130 |
| 5 | d | 10 | 5 | 95 |
| 4 | d | 7 | 4 | 49 |
| 3 | d | 5 | 3 | 38 |
| 2 | d | 4 | 2 | 30 |
| 1 | d | 2 | 1 | 18 |
| not more than 1 | d | 1 | not more than 1 | 11 |

From the results shown in Table 10, it is understood that the difference between the calcium contents in the upper and lower halves of the plate type member along its thickness direction is not more than 10 ppm and the average calcium content in the plate type member is not more than 5 ppm with respect to tungsten when the calcium content in the tungsten powder is not more than 5 ppm, whereby the degree of warp is reduced.

It is also understood that the difference between the calcium contents in the upper and lower halves of the plate type member along its thickness direction is not more than 5 ppm and the average calcium content in the plate type member with respect to tungsten is not more than 3 ppm when the calcium content in the tungsten powder is not more than 3 ppm, whereby the degree of warp is remarkably reduced. It is also understood that the difference between the calcium contents is not more than 2 ppm and the calcium content with respect to tungsten is not more than 1 ppm when the calcium content in the tungsten powder is not more than 1 ppm, whereby the degree of warp is extremely reduced.

EXAMPLE 8

Respective powder materials of tungsten and copper were mixed with each other and embossed/molded into compacts, and lubricants were removed. Thereafter each compact 5 was laid on a refractory plate 3 as shown in FIG. 3 and heated to 1300° C. in a hydrogen atmosphere, thereby melting copper powder contained in the compact 5 and causing liquid phase sintering. Thus, sintered bodies of a Cu—W alloy were obtained in the composition of SW-30 in Table 4 and dimensions slightly larger than the dimensions d in Table 2. Upper and lower surfaces and outer peripheries of the alloys were ground to form plate type members in the dimensions d in Table 2.

Through employment of tungsten powder materials having different calcium contents, differences between the calcium contents between upper and lower halves of the plate type members and variations of warps of the plate type members depending on the calcium contents were investigated. Table 11 shows the results. The calcium contents and the degrees of warps were measured similarly to those in Example 1.

TABLE 11

| Ca Content in W Powder (ppm) | Dimensions | Ca Content Difference in Alloy (ppm) | Ca Content per W in Alloy (ppm) | Warp (μm) |
| --- | --- | --- | --- | --- |
| 6 | d | 14 | 6 | 136 |
| 5 | d | 9 | 5 | 98 |
| 4 | d | 8 | 4 | 74 |
| 3 | d | 5 | 3 | 55 |
| 2 | d | 4 | 2 | 34 |
| 1 | d | 2 | 1 | 27 |
| not more than 1 | d | 1 | not more than 1 | 17 |

From the results shown in Table 11, it is understood that the difference between the calcium contents in the upper and lower halves of the plate type member along its thickness direction is not more than 10 ppm and the calcium content relative to tungsten is not more than 5 ppm when the calcium content in the tungsten powder is not more than 5 ppm, whereby the degree of warp is reduced.

It is also understood that the difference between the calcium contents in the upper and lower halves of the plate type member along its thickness direction is not more than 5 ppm and the calcium content relative to tungsten is not more than 2 ppm when the calcium content in the tungsten powder is not more than 3 ppm, whereby the degree of warp is remarkably reduced. It is also understood that the difference between the calcium contents in the upper and lower halves of the plate type member along its thickness direction is not more than 2 ppm and the calcium content relative to tungsten is not more than 1 ppm when the calcium content in the tungsten powder is not more than 1 ppm, whereby the degree of warp is extremely reduced.

Figure 7:
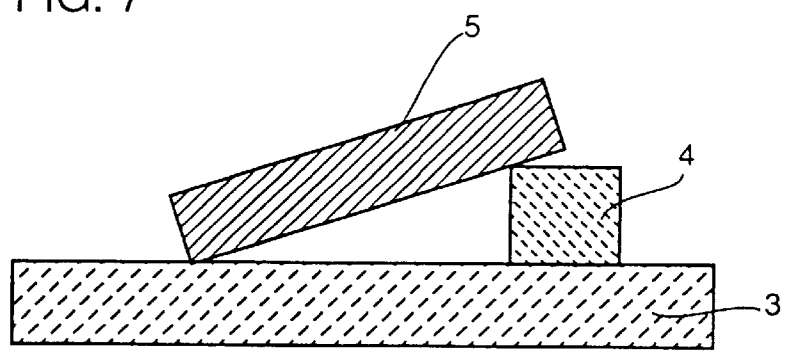
FIG. 7 is a sectional view showing another mounted state of a compact in sintering according to the present invention.

While the skeleton, the compact, the infiltrated body or the sintered body was stood vertically upright on the refractory plate as the inventive method in each of the aforementioned Examples, results which were similar to those of the aforementioned respective Examples were obtained also when a compact 5 was obliquely placed on a refractory plate 3 so as not to be in surface contact therewith and a copper plate 3 was superposed on or under the oblique compact 5 as shown in FIG. 7. This also applies to a skeleton, an infiltrated body and a sintered body.

EXAMPLE 9

Figure 8:
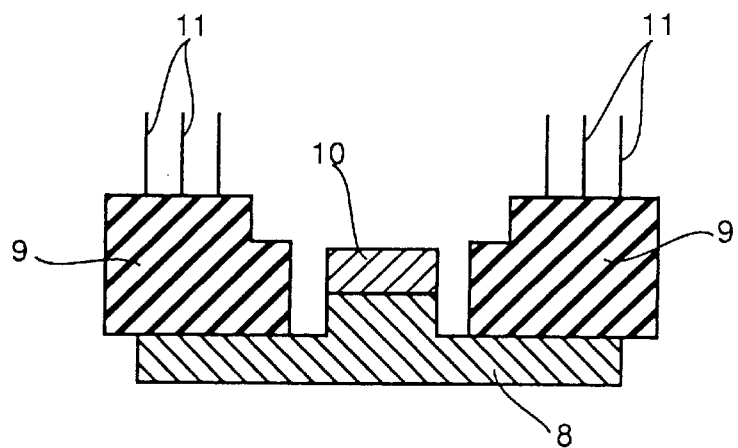
FIG. 8 is a schematic sectional view showing an exemplary ceramic package for a semiconductor IC employing a plate type member according to the present invention.
Figure 9:
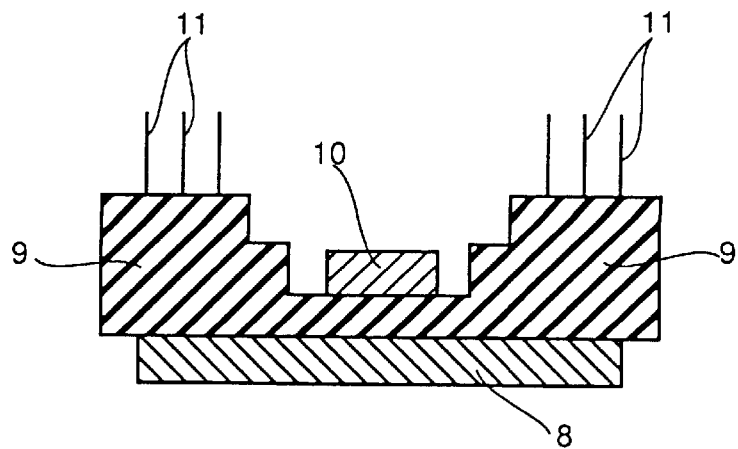
FIG. 9 is a schematic sectional view showing another exemplary ceramic package for a semiconductor IC employing a plate type member according to the present invention.

FIGS. 8 and 9 illustrate exemplary ceramic packages for semiconductor ICs employing plate type members according to the present invention. In each of these figures, numeral 8 denotes a plate type member consisting of a copper-tungsten alloy, a copper-molybdenum alloy or a copper-tungsten-molybdenum alloy according to the present invention, numeral 9 denotes a ceramic envelope member forming a multilayer circuit, numeral 10 denotes a semiconductor IC chip, and numeral 11 denotes connecting pins respectively.

As shown in FIG. 8, the semiconductor IC chip 10 serving as a semiconductor device is mounted on a convex or protruding surface of the plate type member 8. The envelope member 9 is provided around the plate type member 8.

In the ceramic package shown in FIG. 9, on the other hand, the envelope member 9 is provided on the plate type member 8. The semiconductor IC chip 10 serving as a semiconductor device is mounted on the envelope member 9.

While the inventive plate type members are applied to ceramic packages employing ceramic envelopes in the above examples, the inventive plate type member consisting of a copper-tungsten alloy, a copper-molybdenum alloy or a copper-tungsten-molybdenum alloy is also applicable to another type of package such as a metal package, as a matter of course.

Applications of the inventive plate type members to various types of packages were studied, whereby the degrees of warps of the plate type members caused by heating in plating steps etc. were extremely reduced and the yields were remarkably improved. The effects were remarkable when diagonal lengths (in case of rectangular plates) or diameters (in case of circular plates) were at least 40 mm, in particular. Thus, the problem of warping which has been unsettled in the prior art has been substantially overcome, and it has been recognized that it is possible to obtain various packages with higher reliability by improving air-tightness thereof.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A plate type member suitable for use in a semiconductor device package,
    wherein said plate type member is mainly composed of a copper alloy that is selected from the group consisting of a copper-tungsten alloy, a copper-molybdenum alloy and a copper-tungsten-molybdenum alloy, and that contains at least one impurity including a positive amount of an alkaline earth metal,
    wherein said plate type member has first and second opposite major surfaces and consists of first and second half body regions respectively along said first and second major surfaces, and
    wherein said first and second half body regions respectively contain different concentrations of said alkaline earth metal with a difference between said concentrations being not more than 10 ppm.

2. The plate type member in accordance with claim 1, wherein said difference between said concentrations of said alkaline earth metal contained in said first and second half body regions is not more than 5 ppm.

3. The plate type member in accordance with claim 1, wherein said difference between said concentrations of said alkaline earth metal contained in said first and second half body regions is not more than 2 ppm.

4. The plate type member in accordance with claim 1, wherein said alkaline earth metal is calcium.

5. The plate type member in accordance with claim 1, wherein said plate type member has a rectangular or circular flat surface, respectively with a diagonal or diametral length of at least 40 mm.

6. The plate type member in accordance with claim 5, wherein said diagonal or diametral length is at least 70 mm.

7. The plate type member in accordance with claim 5, wherein said plate type member has a warpage deviation away from a flat plane of no more than 45 $\mu$m.

8. The plate type member in accordance with claim 7, wherein said warpage deviation is no more than 35 $\mu$m.

9. A plate type member suitable for use in a semiconductor device package,
    wherein said plate type member is mainly composed of a copper alloy that is selected from the group consisting of a copper-tungsten alloy, a copper-molybdenum alloy and a copper-tungsten-molybdenum alloy, and that contains at least one impurity including a positive amount of an alkaline earth metal, and
    wherein a concentration of said alkaline earth metal contained in said plate type member is not more than 5 ppm with respect to a total content of said tungsten and said molybdenum contained in said plate type member.

10. The plate type member in accordance with claim 9, wherein said concentration of said alkaline earth metal is not more than 3 ppm.

11. The plate type member in accordance with claim 9, wherein said concentration of said alkaline earth metal is not more than 1 ppm.

12. The plate type member in accordance with claim 9, wherein said alkaline earth metal is calcium.

13. The plate type member in accordance with claim 9, wherein said plate type member has a rectangular or circular flat surface, respectively with a diagonal or diametral length of at least 40 mm.

14. The plate type member in accordance with claim 13, wherein said diagonal or diametral length is at least 70 mm.

15. A semiconductor device package comprising:
    a plate type member in accordance with claim 1, wherein one of said major surfaces is suitable for mounting a semiconductor device thereon; and
    an envelope member mounted on said plate type member.

16. A semiconductor device package comprising:
    a plate type member in accordance with claim 9, having a major surface suitable for mounting a semiconductor device thereon; and
    an envelope member mounted on said plate type member.

* * * * *

UNITED STATES PATENT AND TRADEMARK OFFICE
CERTIFICATE OF CORRECTION

PATENT NO. : 5,990,548
DATED : November 23, 1999
INVENTOR(S) : Mitsunori Kobayashi, et al.

It is certified that error appears in the above-identified patent and that said Letters Patent is hereby corrected as shown below:

On the title page, item [54] and column 1:

TITLE, line 2, after "DEVICE" delete "PACKAGE" (first occurrence);

Item: [57] ABSTRACT, line 10, before "preferably" delete "delete "an alkaline earth"
line 15, before "out" replace "carryiing" by --carrying--; after "infiltration" delete ",";
line 16. after "cooling" delete "replace";

Col. 11, line 46, after "to" replace "125°C." by --1250°C.--;

Signed and Sealed this

Eleventh Day of July, 2000

Q. TODD DICKINSON

*Attest:*

*Attesting Officer*      *Director of Patents and Trademarks*